US011482836B2

(12) United States Patent
Rigault et al.

(10) Patent No.: US 11,482,836 B2
(45) Date of Patent: Oct. 25, 2022

(54) LASER DIODE DRIVER CIRCUITS AND METHODS OF OPERATING THEREOF

(71) Applicant: STMicroelectronics (Grenoble 2) SAS, Grenoble (FR)

(72) Inventors: Samuel Rigault, Grenoble (FR); Nicolas Moeneclaey, Vourey (FR); Xavier Branca, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 23 days.

(21) Appl. No.: 16/774,889

(22) Filed: Jan. 28, 2020

(65) Prior Publication Data
US 2021/0234336 A1 Jul. 29, 2021

(51) Int. Cl.
*H01S 5/042* (2006.01)
*H01S 5/068* (2006.01)

(52) U.S. Cl.
CPC ........ *H01S 5/0428* (2013.01); *H01S 5/06825* (2013.01); *H01S 5/06817* (2013.01)

(58) Field of Classification Search
CPC .................................................. H01S 5/0428
See application file for complete search history.

(56) References Cited

U.S. PATENT DOCUMENTS

| 4,751,524 A * | 6/1988 | Balchunas ............. H01S 5/024 372/38.03 |
| 6,018,538 A * | 1/2000 | Ota ................... H03K 17/04106 372/38.02 |
| 6,285,692 B1 * | 9/2001 | Okayasu ................. H01S 5/042 372/38.02 |
| 7,274,151 B2 * | 9/2007 | Wakou ................... H05B 44/00 345/82 |
| 7,873,085 B2 | 1/2011 | Babushkin et al. |
| 7,898,187 B1 | 3/2011 | Mei et al. |

(Continued)

FOREIGN PATENT DOCUMENTS

| EP | 0886350 A1 | 12/1998 |
| EP | 1237240 A2 | 9/2002 |
| EP | 0886350 B1 | 9/2003 |

OTHER PUBLICATIONS

Blasco et al., "A Sub-ns Integrated CMOS Laser Driver With Configurable Laser Pulses for Time-of-Flight Applications", IEEE Sensors Journal, vol. 18, No. 16, Aug. 15, 2018, 10 pages.

(Continued)

*Primary Examiner* — Tod T Van Roy
(74) *Attorney, Agent, or Firm* — Slater Matsil, LLP

(57) ABSTRACT

A driver circuit includes a fly capacitor with a first end and a second end. The driver circuit includes a laser diode having an anode and a cathode. The driver circuit is configured to operate in first and second operating states. The anode is coupled to the first end of the fly capacitor. In the first operating state, the cathode is coupled to a first voltage supply node, the first end of the fly capacitor is coupled to a second voltage supply node, and the second end of the fly capacitor is coupled to a first reference terminal. In the second operating state, the cathode is coupled to a second reference terminal and decoupled from the first voltage supply node, the first end of the fly capacitor is decoupled from the second voltage supply node, and the second end of the fly capacitor is coupled to a third reference terminal.

28 Claims, 11 Drawing Sheets

(56) References Cited

U.S. PATENT DOCUMENTS

| | | | |
|---|---|---|---|
| 8,154,217 B2 | 4/2012 | Bergmann et al. | |
| 8,660,158 B2 * | 2/2014 | Miyajima | H01S 5/0428 372/38.02 |
| 9,185,762 B2 * | 11/2015 | Mark | H05B 45/37 |
| 10,153,612 B1 * | 12/2018 | Zhang | H01S 5/042 |
| 10,365,353 B2 * | 7/2019 | Krelboim | G01S 7/484 |
| 10,581,221 B1 * | 3/2020 | Lenius | G01S 7/4814 |
| 2002/0171467 A1 | 11/2002 | Worley, Sr. et al. | |
| 2003/0002551 A1 * | 1/2003 | Kwon | H01S 5/042 372/38.02 |
| 2003/0156439 A1 | 8/2003 | Ohmichi et al. | |
| 2004/0257140 A1 * | 12/2004 | Bergmann | G05F 3/265 327/304 |
| 2008/0043792 A1 | 2/2008 | Bozso et al. | |
| 2009/0014752 A1 * | 1/2009 | Ueda | H01S 5/042 257/E33.001 |
| 2012/0081021 A1 * | 4/2012 | Horiuchi | H01S 5/042 315/224 |
| 2012/0294324 A1 * | 11/2012 | Miyajima | H01S 5/0428 372/38.02 |
| 2013/0094530 A1 * | 4/2013 | Nakashima | H01S 5/0427 372/38.02 |
| 2014/0211192 A1 | 7/2014 | Grootjans et al. | |
| 2015/0130903 A1 | 5/2015 | Thompson et al. | |
| 2016/0341664 A1 * | 11/2016 | Rothberg | H01L 27/14603 |
| 2017/0187164 A1 * | 6/2017 | Thompson | H04N 13/254 |
| 2017/0269146 A1 * | 9/2017 | Regau | H05B 45/58 |
| 2017/0276771 A1 * | 9/2017 | Hayami | G01S 7/4817 |
| 2020/0006915 A1 * | 1/2020 | Moeneclaey | H01S 5/042 |
| 2020/0153195 A1 * | 5/2020 | Kupcho | G01R 31/2837 |
| 2020/0256954 A1 * | 8/2020 | Kapusta | G01S 17/10 |
| 2020/0393543 A1 * | 12/2020 | David | H01S 5/0428 |
| 2021/0021098 A1 * | 1/2021 | Kaymaksut | H01S 5/0428 |
| 2021/0104866 A1 * | 4/2021 | Avci | H03K 17/164 |
| 2021/0218223 A1 * | 7/2021 | Letor | H01S 5/0428 |
| 2021/0234336 A1 * | 7/2021 | Rigault | H01S 5/0428 |
| 2022/0013984 A1 * | 1/2022 | Letor | H03K 5/07 |

OTHER PUBLICATIONS

Nissinen et al., "A High Repetition Rate CMOS Driver for High-Energy Sub-ns Laser Pulse Generation in SPAD-Based Time-of-Flight Range Finding", IEEE Sensors Journal, vol. 16, No. 6, Mar. 15, 2016, 6 pages.

Texas Instruments, "Illumination Driving for Time-of-Flight (ToF) Camera System", Application Report, SBAA209B—Aug. 2016—Revised Aug. 2019, 17 pages.

* cited by examiner

LASER DIODE DRIVER CIRCUITS AND METHODS OF OPERATING THEREOF

TECHNICAL FIELD

The present invention relates generally to driver circuits, and particularly to laser diode driver circuits and methods of operating thereof.

BACKGROUND

A growing number of technical applications utilize sub nanosecond pulses to drive laser diodes. Such applications include, but are not limited to, devices and methods related vertical cavity surface emitting lasers (VCSEL) for single photon avalanche diode (SPAD) based time-of-flight (TOF) sensors. Controlling the current through a diode in a system with short duration pulses can be problematic. It can also be difficult to limit optical tailing in VCSELs in these and other conditions.

SUMMARY

In accordance with an embodiment of the present invention, a driver circuit includes a fly capacitor. The fly capacitor includes a first end and a second end. The driver circuit includes a laser diode that includes an anode and a cathode. The driver circuit is configured to operate in a first operating state and a second operating state. The anode is coupled to the first end of the fly capacitor. In the first operating state, the cathode is coupled to a first voltage supply node, the first end of the fly capacitor is coupled to a second voltage supply node, and the second end of the fly capacitor is coupled to a first reference terminal. In the second operating state, the cathode is coupled to a second reference terminal and decoupled from the first voltage supply node, the first end of the fly capacitor is decoupled from the second voltage supply node, and the second end of the fly capacitor is coupled to a third reference terminal.

In accordance with an embodiment of the present invention, a method of operating a laser diode includes having a driver circuit. The driver circuit includes a fly capacitor. The fly capacitor includes a first end and a second end. The driver circuit includes a laser diode that includes an anode and a cathode. The anode is coupled to the first end of the fly capacitor. The method includes charging the first end of the fly capacitor to a first potential. The method includes generating a current pulse by discharging the fly capacitor through the laser diode by driving the laser diode in forward bias. The method includes recharging the first end of the fly capacitor to the first potential and driving the laser diode in reverse bias.

In accordance with an embodiment of the present invention, a driver circuit includes a current mirror coupled to a supply voltage node. The driver circuit includes a programmable current source coupled to a first path of the current mirror. The driver circuit includes a decoupling capacitor coupled to a second path of the current mirror. The driving circuit includes an output node coupled between the decoupling capacitor and the current mirror on the second path. The driver circuit includes a laser diode coupled to the output node. The driver circuit is configurable to provide a fixed current pulse through the laser diode by selecting the programmable current source.

In accordance with an embodiment of the present invention a method for controlling current through a laser diode includes having a current mirror coupled to a supply voltage node with a programmable current source coupled to a first path of the current mirror and a decoupling capacitor coupled to a second path of the current mirror. The method includes having an output node coupled between the decoupling capacitor and the current mirror on the second path of the current mirror. The method include selecting a fixed current pulse for a laser diode by setting the programmable current source. The method includes charging the decoupling capacitor with a charging current on the second path of the current mirror, the charging current mirroring a programmable current set by the programmable current source. The method includes discharging the decoupling capacitor through the output node to provide the fixed current pulse through the laser diode.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Embodiments of the present application disclose circuits and methods for applying short duration pulses through laser diodes and with an ability to both forward and reverse bias the diodes. A laser diode operates by emitting photons when being subjected to a forward bias. However, in some user applications, the laser diodes are expected to operate for extremely short times, in other words, the laser diodes are expected to emit light in short pulses.

In addition, during operation, laser diodes generate a large number of excited charge carriers, which recombine to produce photons. During forward bias, charge carriers are generated within the active region of the laser diode. Thus, when the laser diode current is modulated from a value above threshold to a sub-threshold (so that it is no longer in forward bias), the laser diodes may continue to emit a small intensity of photons as the remaining charge in the active region is slowly dissipated as photons even after the forward bias is removed. More specifically, the charge is dissipated at the rate of the spontaneous recombination lifetime which is on the order of a nanosecond. This is observed in conventional circuits as an optical tail—it is therefore a major limitation for the generation of fast sub-nanosecond pulses.

Embodiments of the present application describe a laser diode driving circuit with reduced optical tailing by applying a short reverse bias to sweep the remaining charge carriers from the active region of the laser diode.

Accordingly, embodiments of the present invention provide a laser diode driving circuit, where the laser diode is reverse biased between the current pulses that activate (forward bias) the diode. Thus, reverse biasing the laser diode limits optical tailing in a VCSEL laser diode. While embodiments of the present application are described, for clarity, using VCSEL laser diodes, embodiments of this disclosure are not limited to circuits that utilize VCSEL laser diodes, and they can be combined with other laser diodes known in the art.

Disclosed herein are methods and devices for a reverse-biasing laser diode driving circuit. A first embodiment of a laser driver circuit will be discussed using FIG. 1. Further embodiments will described using FIGS. 6 and 9-10. Methods of operating the laser driver circuits will be described using FIGS. 5 and 8.

Figure 1:
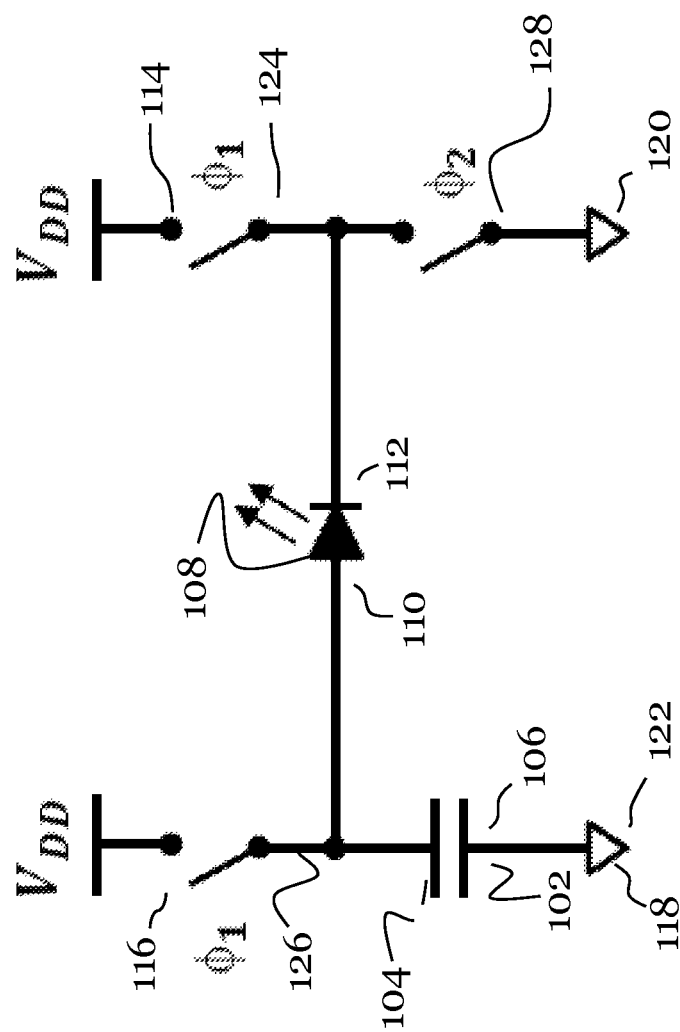
FIG. 1 illustrates a schematic circuit of an embodiment of a reverse biasing laser diode driving circuit.

FIG. 1 illustrates an embodiment of a reverse-biasing driver circuit 100 that allows reverse biasing of a laser diode. The reverse-biasing driver circuit 100 of the embodiment depicted in FIG. 1 comprises a fly capacitor 102 comprising a first end 104 and a second end 106. In some embodiments, the fly capacitor 102 comprises a capacitor having a first plate at the first end 104 and a second plate at the second end 106.

As illustrated by FIG. 1, embodiments also may comprise a laser diode 108 comprising an anode 110 and a cathode 112, the anode 110 being coupled with the first end 104 of the fly capacitor 102. In some embodiments, the laser diode 108 comprises a vertical-cavity surface-emitting laser (VCSEL).

The reverse-biasing driver circuit 100 has a first reference terminal 118 coupled to the second end 106 of the fly capacitor 102 and a second reference terminal 120 coupled to the third switch 128.

First, second, and third switches 124, 126, and 128 are configured to be switched between ON and OFF states (low resistance states and high resistance states) by the application of a control signal. It will be appreciated by one of ordinary skill in the art that first, second, and third switches 124, 126, and 128 may comprise different forms in different embodiments as will be discussed. The first switch 124 is coupled to a first voltage supply node 114 while the second switch 126 is coupled to a second voltage supply node 116. The first voltage supply node 114 and the second voltage supply node 116 may be coupled to a same voltage supply node during operation in some embodiments.

The reverse-biasing driver circuit 100 may be configured to operate in different states. In a first operating state, the laser diode 108 may be pulsed to cause it to become active while the second operating state may overlap with periods between pulses. FIG. 1 depicts an embodiment of the reverse-biasing driver circuit 100 configured to operate in a first operating state and a second operating state.

In the embodiment depicted in FIG. 1, the first and second switches 124 and 126 are closed in the first operating state and open in the second operating state by applying a first control signal $\varphi_1$. On the other hand, the third switch 128 is open in the first operating state and closed in the second operating state by applying a second control signal $\varphi_2$.

In some embodiments, like the one depicted in FIG. 1, in the first operating state of the reverse-biasing driver circuit 100, first and second switches 124 and 126 are in the ON state (low resistance state). The cathode 112 is coupled to a first voltage supply node 114 and the first end 104 of the fly capacitor 102 is coupled to a second voltage supply node 116. Also, in some embodiments, the second end 106 of the fly capacitor 102 is coupled to a first reference terminal 118. Also in the first state, the third switch 128 is in the OFF state (high resistance state) so the cathode 112 is decoupled from a second reference terminal 120. In one embodiment, the first reference terminal 118 and the second reference terminal 120 are coupled to a ground potential during operation.

In this arrangement, the fly capacitor 102 is charged via the second voltage supply node 116, and a voltage, e.g., coupled to supply voltage $V_{DD}$ is applied to the cathode 112 of the laser diode 108. As the fly capacitor 102 is charged the potential at the anode 110 will increase until it reaches the second voltage supply node 116 (minus the ON state voltage drop across the second switch 126). Similarly, the potential at the cathode 112 is maintained at the first voltage supply node 114 (minus the ON state voltage drop across the first switch 124). In various embodiments, the potential at the first voltage supply node 114, the potential at the second voltage supply node 116 and the voltage drop across the first and second switches 124 and 126 are selected so that there is no potential across the laser diode 108 after the charging of the fly capacitor 102. For example, this is accomplished if the first switch and second switch 124 are and 126 are designed to have similar electrical device parametrics and the first voltage supply node 114 and the second voltage supply node 116 are coupled to the same potential node.

In some embodiments, the first voltage supply node 114 is the second voltage supply node 116 may be coupled to a first and second voltage source, respectively Referring again to FIG. 1, in the second operating state of the reverse-biasing driver circuit 100, the first and second switches 124 and 126 are turned off (OFF state). Additionally, the third switch 128 is now in the ON state and the cathode 112 is coupled to a second reference terminal 120 in the second state. Because the first switch 124 is now in the OFF state, the cathode 112 is decoupled from the first voltage supply node 114. The anode 110 is decoupled from the second voltage supply node 116 because the second switch 126 is the OFF state. Also because the second switch 126 is the OFF state, the first end 104 of the fly capacitor 102 is decoupled from the second voltage supply node 116.

As mentioned above, initially, in the first operating state in some embodiments of the present invention, the fly capacitor 102 is charged via the second voltage supply node 116, e.g., to the supply voltage $V_{DD}$. In such embodiments, as depicted in FIG. 1, at the end of the first operating state $V_{fly}=V_{DD}$ (assuming no other intervening voltage drop), where $V_{fly}$ represents the voltage at the first end 104 of the fly capacitor 102.

During the second operating state, the laser diode 108 has been decoupled from second and first voltage supply nodes 116 and 114 at the anode 110 and the cathode 112 respectively. Meanwhile the cathode 112 has been coupled to the second reference terminal 120. This puts the reverse-biasing driving circuit 100 in an arrangement that allows the fly capacitor 102 to discharge through the laser diode 108. In particular, the laser diode 108 is now in forward bias as the anode 110 is at a higher positive potential than the cathode 112 and the laser diode 108 is able to conduct a current. Thus, charge stored at the fly capacitor 102 is discharged through the laser diode 108 as a current pulse, which causes the laser diode 108 to emit a light pulse.

As the fly capacitor 102 is discharged the potential at the first end 104 of the fly capacitor 102 decreases in magnitude. The voltage in the fly capacitor 102 at the conclusion of the second operating state is described approximately by the following equation:

$$V_{fly} = V_{DD} - \frac{I_{peak} t_{pw}}{C_{fly}},$$

where $I_{peak}$ is the amplitude of the current pulse, $t_{pw}$ is the pulse width, and $C_{fly}$ is the capacitance of the fly capacitor 102.

Once the reverse-biasing driver circuit 100 returns to the first operating state, the first switch 124 is turned into the ON state and the supply voltage $V_{DD}$ is applied to the cathode 112 of the laser diode 108 via the first voltage supply node 114. At the same time, the second switch 126 is also turned into the ON state again coupling the anode 110 and the first end 104 to the second voltage supply node 116. Simultaneously, the third switch 128 is turned into the OFF state and the path from the cathode 112 to the second reference terminal 120 is interrupted.

In some embodiments, the voltage across the laser diode 108, at the beginning of the first operating state, is the difference between the potential at the first end 104 of the fly capacitor 102 $V_{fly}$ and the potential of the first voltage supply node 114 ($V_{DD}$—assuming no other voltage drop). As previously noted, potential at the first end 104 of the fly capacitor 102 $V_{fly}$ is lower than the potential at the second voltage supply node 116 because of the discharging of the fly capacitor 102 through the laser diode 108. Thus, the voltage across the laser diode 108 may be described at this point approximately by the equation $$V_{laser} = V_{fly} - V_{DD} = -\frac{I_{peak} t_{pw}}{C_{fly}}.$$

This advantageously dynamically applies a reverse bias to the laser diode 108 until the potential at the first end 104 of the fly capacitor 102 is brought back up to the second voltage supply node 116 ($V_{DD}$—assuming no other voltage drop). During this duration, the laser diode 108 is under reverse bias, thus, for example, any remaining electrons in the n-type regions of the laser diode 108 are swept into the first voltage supply node 114. This can also be explained as the discharge of the parasitic junction capacitance of the laser diode 108. The quick removal of charge carriers from the active regions of the laser diode 108 prevents any further generation of photons and thus can limit optical tailing in embodiments.

As previously described, the reverse bias is reduced as the fly capacitor 102 is charged back up to the second voltage supply node 116 and the laser diode 108 is subsequently maintained at zero bias. In other words, when the voltage at the first end 104 ($V_{fly}$) reaches the second voltage supply node 116, i.e., $V_{fly}=V_{DD}$, the potential at the anode 110 will be equal to the potential at the cathode 112 and the laser diode 108 will be at zero bias.

The reverse-biasing driving circuit 100 may then enter the second operating state again allowing the charged fly capacitor 102 to discharge through the laser diode 108. This cycle can continue as long as needed.

In some embodiments, the magnitude of the reverse voltage present across the laser diode 108 at the conclusion of the second operating state is tunable by the capacitance of the fly capacitor 102. This can be seen from the equation $$V_{laser} = V_{fly} - V_{DD} = -\frac{I_{peak} t_{pw}}{C_{fly}}.$$

The capacitance, $C_{fly}$, of the fly capacitor 102 appears in the denominator of the component defining the reverse bias. Keeping everything else equal, varying the capacitance can increase or decrease the magnitude of the reverse bias.

The first, second, and third switches 124, 126, and 128 may comprise different forms in different embodiments. In some embodiments, some or all of the switches comprise field effect transistors such as MOSFETS. However, in other embodiments, some or all of the switches 124, 126, and 128 may comprise other types of electronic switches including, but not limited to bipolar transistors, power diodes, insulated gate bipolar transistors, silicon controlled rectifiers, and gate turn-off thyristors. However, for ease of design, the first and the second switches 124 are 126 are identical transistors.

Figure 2:
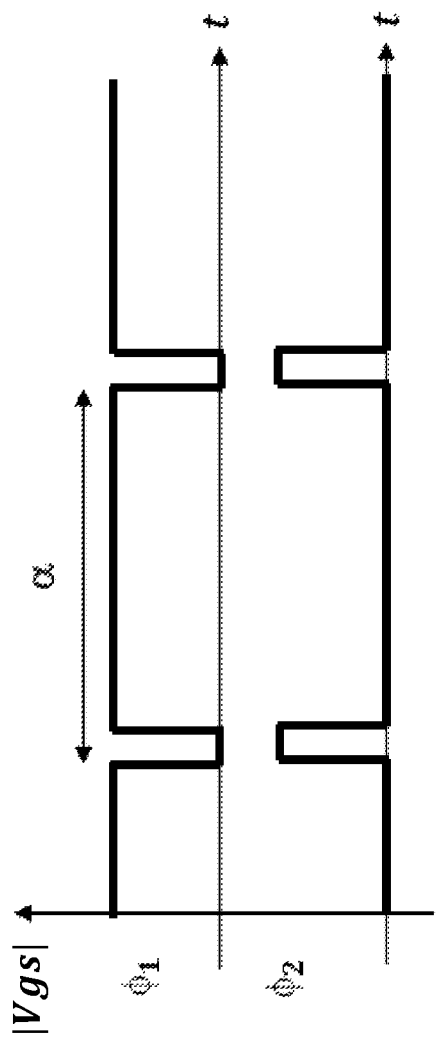
FIG. 2 illustrates waveforms alternating states of an embodiment of the reverse biasing laser diode driving circuit depicted in FIG. 1.
Figure 3:
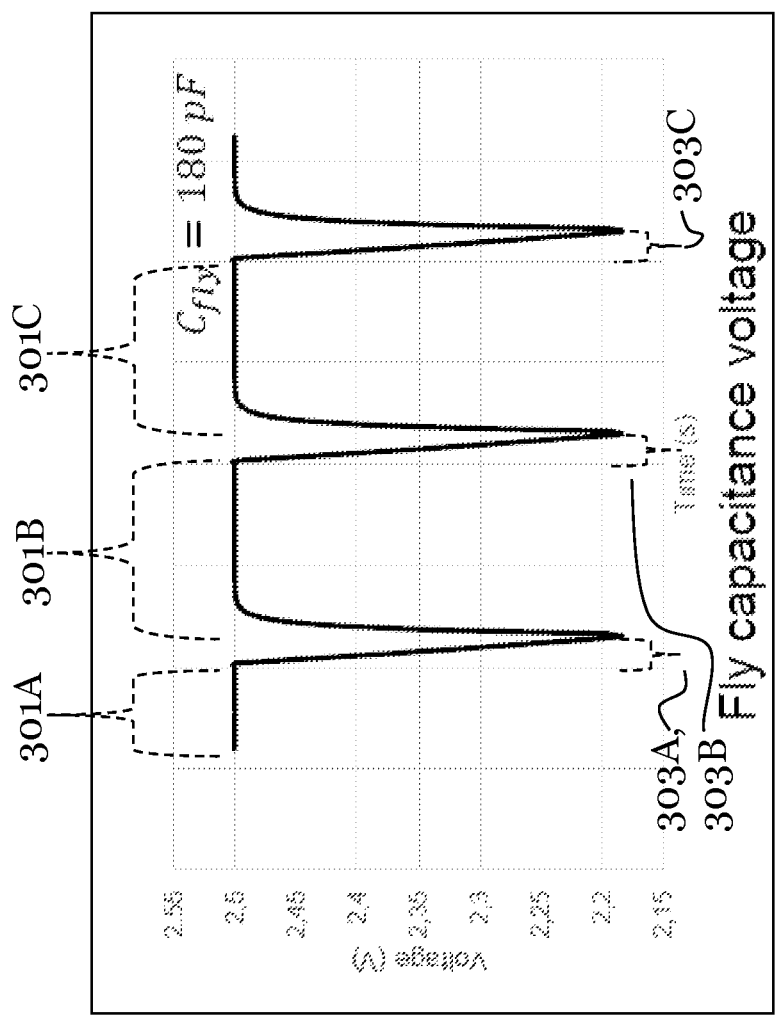
FIG. 3 illustrates the voltage across an embodiment of a fly capacitor of the circuit of FIG. 1.
Figure 4:
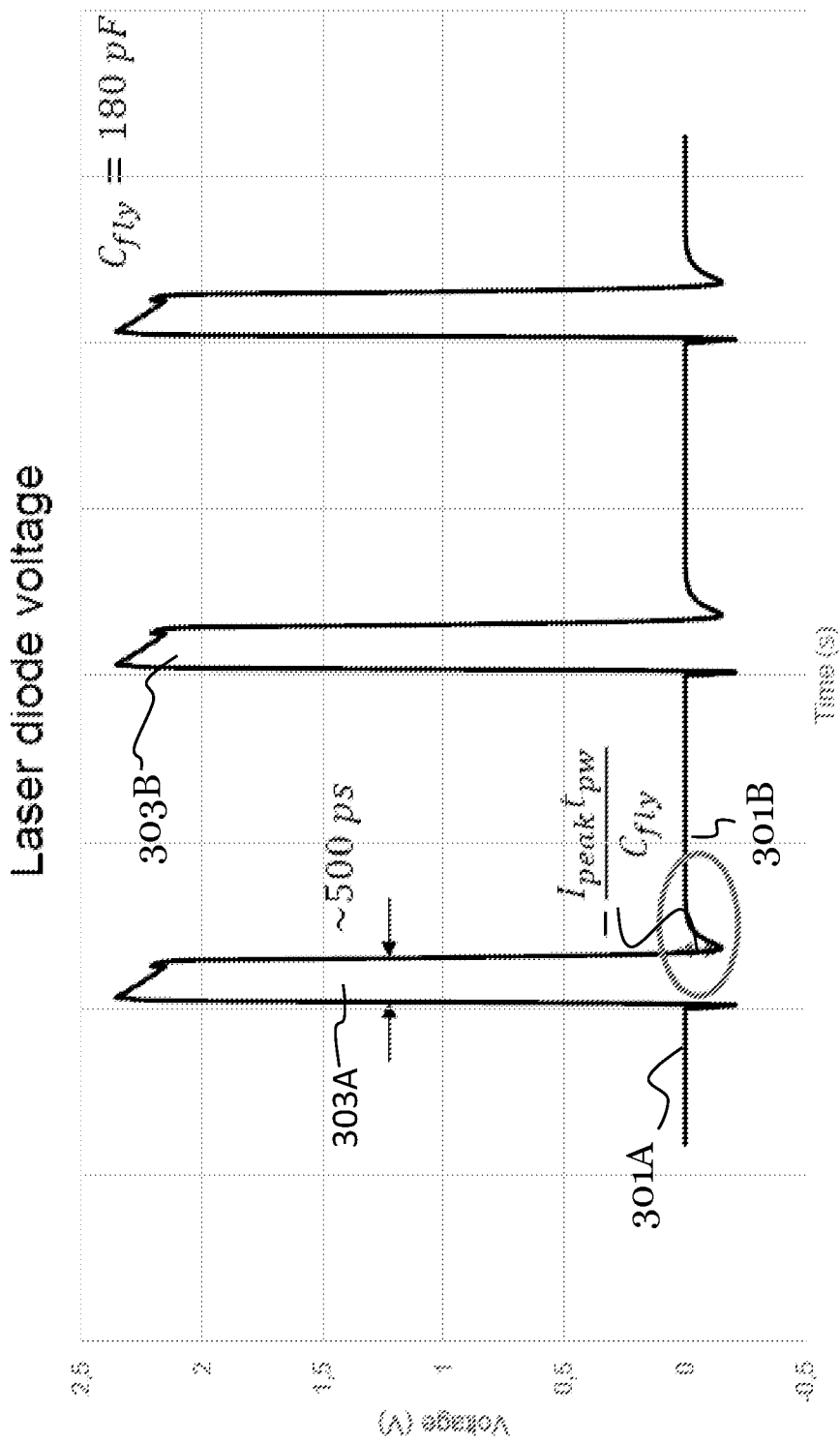
FIG. 4 illustrates the voltage across an embodiment of a laser diode of the circuit of FIG. 1.

FIGS. 2-4 further illustrate the operation of embodiments of the reverse bias laser driving circuit of FIG. 1. FIG. 2 illustrates examples of waveforms used as inputs for switches 124, 126 and 128 to alternate some embodiments of the reverse biasing laser diode driving circuit like the one depicted in FIG. 1 between first and second operating states.

As mentioned above, switches in FIG. 1 receiving first control signal $\varphi_1$ are closed in the first operating state and open in the second operating state while switches receiving second control signal $\varphi_2$ are open in the first operating state and closed in the second operating state. FIG. 2 depicts waveforms that can achieve this operation in some embodiments. However, it should be appreciated, that embodiments of the reverse-biasing driving circuit 100 utilizing different embodiments of the first, second, and third switches 124, 126, and 128 may achieve the appropriate operation by other waveform combinations.

As illustrated in FIG. 2, the first, second, and third switches 124, 126, 128 are controlled by a gate to source voltage $V_{gs}$. The first control signal $\varphi_1$ has a first waveform for $V_{gs}$ while the second control signal $\varphi_2$ has a second waveform for $V_{gs}$. As illustrated, the first control signal $\varphi_1$ is in opposite in phase with the second control signal $\varphi_2$.

In the first operating state reference as "I" in FIG. 2, the first control signal $\varphi_1$ is high while the second control signal $\varphi_2$ is low. In the second operating state, the first control signal $\varphi_1$ is low while the second control signal $\varphi_2$ is high. In this illustration, a high $V_{gs}$ state corresponds to a closed or ON state for a switch while a low $V_{gs}$ state corresponds to an open or OFF state for the switch (e.g., assuming an enhancement mode NMOS FET). And, in corresponding to FIG. 1, these waveforms will turn the first and second switches 124 and 126 into the ON state in the first operating state and switch the first and second switches 124 and 126 into the OFF state in the second operating state. The third switch 128 is turned into the ON state in the second operating state and into the OFF state in the first operating state. As can be appreciated, NMOS FET offer one embodiment of a switch corresponding to the waveforms presented in FIG. 2. As known to a person having ordinary skill in the art, the waveforms for open and closed state would be opposite if a PMOS FET is used.

FIG. 3 illustrates the voltage across the fly capacitor 102 in a specific illustrative embodiment of the reverse-biasing driving circuit 100 from FIG. 1 to better understand the operation of the reverse-biasing driving circuit 100.

In the illustrative embodiment depicted in FIG. 3, the fly capacitor 102 comprises has a capacitance of 180 pF. In the illustration, the voltage of the fly capacitor 102 is sketched during repeating cycles of the first operating state (I) (time periods 301A, 301B, 301C) and the second operating state (II) (time periods 303A, 303B, 303C).

The fly capacitor 102 is charged in the first operating state (time period 301A) to a voltage of 2.5 V. Once the fly capacitor 102 is charged, the potential at the cathode 112 is approximately equal to the potential at the anode as described previously.

In the second operating state, the fly capacitor 102 discharges triggering the laser diode 108. This is depicted for the first time in FIG. 3 at 303A. During this time period 303A, the fly capacitor 102 loses its charge declining to approximately 2.175 V. When returned to the first operating state at 301B, the fly capacitor 102 begins to charge and the voltage of the fly capacitor rises towards 2.5 V. A reverse bias will exist in the laser diode 108 for the short time during which the fly capacitor 102 is being charged until it reaches 2.5 volts. This charge and discharge cycle can continue indefinitely. It is noted that the values presented in FIG. 3 are for demonstrative purposes only. The capacitance, voltage, and duration of the first and second time periods may be varied in different embodiments.

FIG. 4 illustrates the voltage across the laser diode 108 in first and second operating states in an embodiment. In the first operating state (time period 301A) the voltage across the laser diode 108 remains at zero bias.

In the second operating state, as the cathode 112 and anode 110 are decoupled from the first voltage supply node 114 and the second voltage supply node 116 respectively, the voltage across the laser diode rapidly increases, which generates a current pulse. This can be seen at 303A in FIG. 4.

In the next cycle of the first operating state, the cathode 112 and the anode 110 are again coupled to the first voltage supply node 114 and the second voltage supply node 116. However, due to the charge lost by the fly capacitor 102 during the pulse at time period 303A, the potential at the cathode 112 is less than the potential at anode 110 so the laser diode 108 is reverse biased.

As demonstrated in FIG. 4, the voltage across the laser diode 108 becomes reverse biased by an amount equal $$\text{to} - \frac{I_{peak} t_{pw}}{C_{fly}}$$

instantaneously when the reverse-biasing driver circuit 100 reenters the first operating state in the time period 301B. As the fly capacitor 102 is recharged during the first operating state, the magnitude of the reverse biasing of the laser diode 108 declines until the potential at the cathode 112 is approximately equal to the potential at the anode 110. At this point the voltage across the laser diode 108 is zero.

When the reverse-biasing driving circuit 100 enters the second operating state once more at time period 303B, the fly capacitor 102 is discharged again to produce another pulse. Charging and discharging of the fly capacitor 102 and pulsing of the laser diode 108 can then continue indefinitely as the reverse-biasing driving circuit 100 cycles between first and second operating states. FIG. 4 depicts a pulse width of 500 ps, however the pulse width may vary in different embodiments. Likewise, the peak current $I_{peak}$, and the fly capacitance $C_{fly}$ may vary in different embodiments.

The value of the fly capacitance $C_{fly}$ may be selected according to the specifications of the laser diode 108. For example, in one or more embodiments, a value of 100 pF may be selected for a $I_{peak}$ of approximately 100 mA with a $t_{pw}$ of less than 1 ns. Or, in other embodiments, a value of 1 nF may be selected to achieve $I_{peak}$ of 1 A and a $t_{pw}$ greater than 1 ns.

In some embodiments, the reverse-biasing driving circuit 100 may have more than two operating states. For example, the reverse-biasing driving circuit 100 may have a standby state, or intermediate operating states.

In some embodiments, the first voltage supply node 114 and the second voltage supply node 116 may be coupled to the same voltage source. In some embodiments, the first voltage supply node 114 and the second voltage supply node 116 may be coupled to different voltage sources that have the same potential.

In some embodiments, the laser diode 108 is reverse biased in the first operating state until the fly capacitor 102 is charged to a potential substantially equal to the potential at the first voltage supply node 114.

Figure 5:
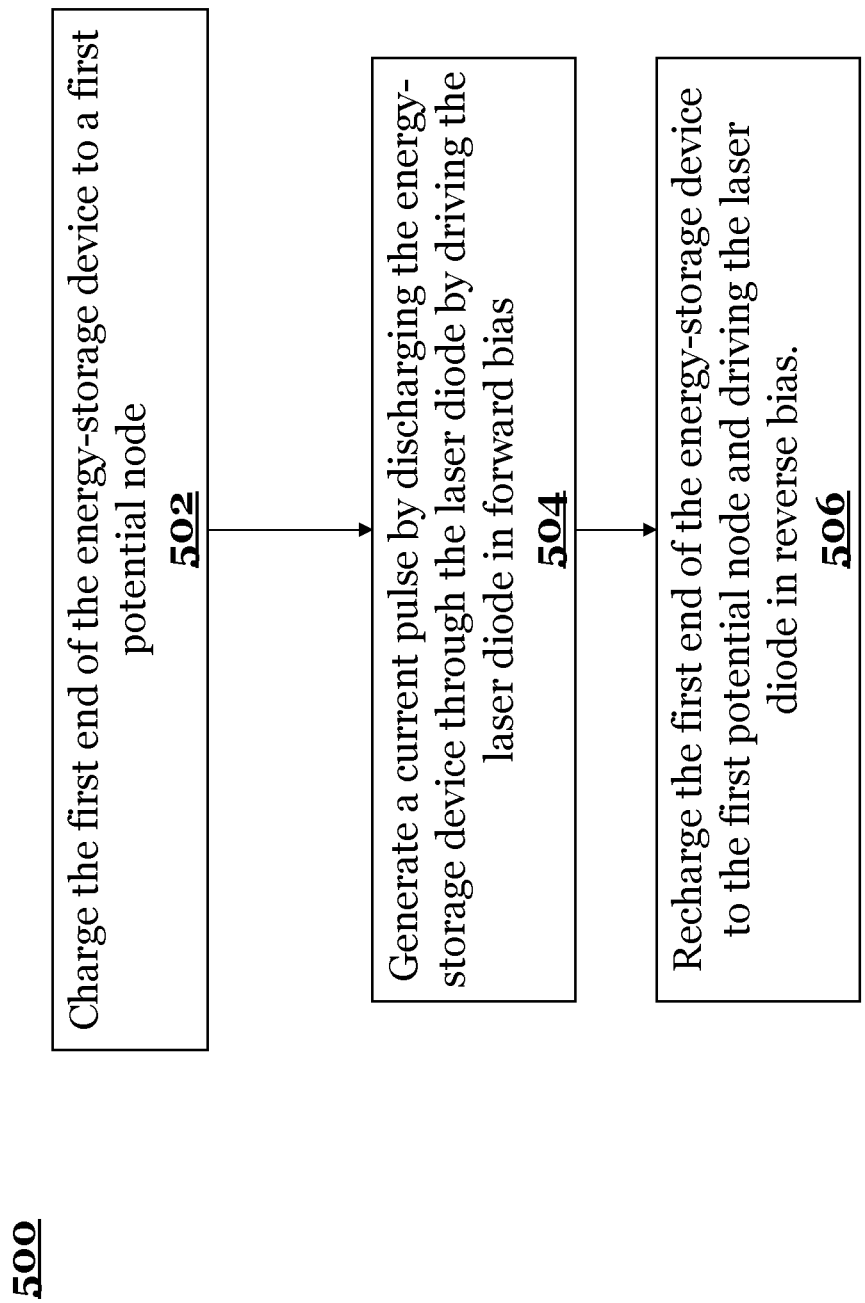
FIG. 5 illustrates a block diagram of a method of operating a laser diode in accordance with an embodiment of the present invention.

FIG. 5 illustrates a block diagram of a method of operating a laser diode. The method 500 comprising having a driver circuit comprising a fly capacitor comprising a first end and a second end, and a laser diode comprising an anode and a cathode, the anode being coupled to the first end of the fly capacitor. Examples of the fly capacitor of embodiments of this method 500 include, but are not limited to, fly capacitor 102 and fly capacitor 602 discussed in various embodiments above.

As illustrated in FIG. 5, in embodiments the method 500 comprises charging the first end of the fly capacitor to a first potential node at 502. The method further comprises generating a current pulse by discharging the fly capacitor through the laser diode by driving the laser diode in forward bias at 504. Examples of the laser diode of embodiments of this method 500 include, but are not limited to, laser diode 108 and laser diode 608. In embodiments, the method further comprises at 506 recharging the first end of the fly capacitor to the first potential node and driving the laser diode in reverse bias.

In some embodiments, the method 500 further comprises coupling the cathode to an energy potential while the fly capacitor is recharging, the energy potential being substantially equal to the first potential node thereby reverse biasing the laser diode until the fly capacitor is recharged to the first potential node.

In some embodiments, the method 500 further comprises decoupling the cathode from the energy potential by one or more switches when the laser diode is driven in forward bias.

In some embodiments, the method 500 further comprises decoupling the first end of the fly capacitor and the anode from a charging energy source by one or more switches when the fly capacitor is discharging.

In some embodiments, the method 500 further comprises determining the magnitude of the current pulse by setting a programmable current source of a current control driver that mirrors the charging current of a decoupling capacitor that is charged in parallel with the fly capacitor and discharged in series with the fly capacitor while the fly capacitor is discharged to generate the current pulse.

In some embodiments, the method 500 further comprises toggling the decoupling capacitor and the fly capacitor between a parallel arrangement and serial arrangements with one or more switches.

In some embodiments of the method 500, determining the current pulse determines a peak current and an average current through the laser diode during the current pulse.

In some embodiments of the method 500, the peak current and the average current is each further determined by a duty cycle of the current pulse.

Figure 6:
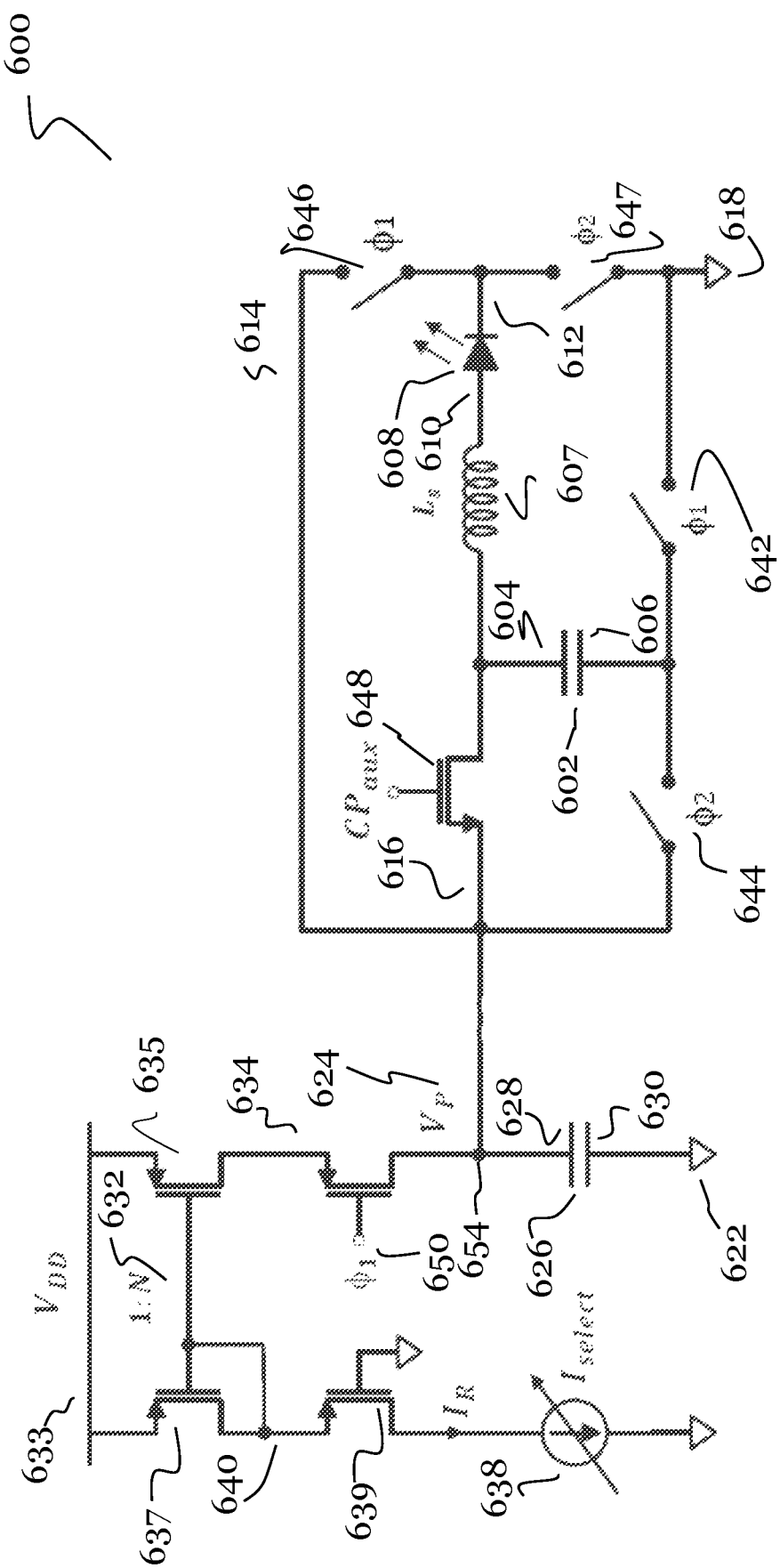
FIG. 6 illustrates a schematic of a current controlled laser diode driving circuit in accordance with an embodiment of the present invention.

FIG. 6 illustrates an embodiment of current controlled laser diode driving circuit 600. The embodiments of the invention presented herein also include embodiments of a laser diode driving circuit with current control.

The switches of some embodiments of the method 500 may include, but are not limited to, the switches 124, 126, 128, 642, 644, 646, and 647, 648 and 650. The current mirror of some embodiments of the method 500 may include, but is not limited to the current mirror 632. The programmable current source of some embodiments of method 500 may include, but are not limited to 638.

In the embodiment discussed in FIG. 1, the total charge (therefore the current pulse) through the laser diode is determined by the charge of the energy storage To more accurately control the current pulse through the laser driver, embodiments of the invention provide an additional decoupling capacitor having a larger capacitance than the charge storing capacity of the fly capacitor 102 to charge the fly capacitor 102. The decoupling capacitor is charged through a current mirror circuit having a programmable current source to adjust the charging of the decoupling capacitor. Further details of this embodiment are explained in more detail below.

As illustrated in FIG. 6, in various embodiments, the current controlled laser diode driving circuit 600 comprises a current mirror 632 coupled to a current mirror voltage supply node 633. Some embodiments of the current controlled laser diode driving circuit 600 further comprise a programmable current source 638 coupled to a first path 640 of the current mirror 632. Some embodiments, like the one depicted in FIG. 6 also comprise a decoupling capacitor 626 coupled to a second path 634 of the current mirror 632. An output node 654 is coupled between the decoupling capacitor 626 and the current mirror 632, in some embodiments. A laser diode 608 can be coupled to the output node 654 where the current controlled laser diode driving circuit 600 is configurable to provide a fixed current pulse through the laser diode 608 by selecting the programmable current source 638. In embodiments, laser diode 608 comprises a VCSEL.

The current mirror 632 may be used to provide a current along a second path 634 that is determined from, or "mirrors" the current along a first path 640. In some embodiments, the current along the second path 634 of the current mirror 632 may be a multiplied value of the current across the first path 640. This ratio of current in the first path 640 to the second path 634 may be represented by notation 1:N where N is the multiplier.

The architecture of embodiments of the current controlled laser diode driving circuit 600 of this disclosure, like the one depicted in FIG. 6, allow a voltage $V_p$ at the output node 654 to be adjusted by charges provided by the second path 634 of the current mirror 632. The current along the second path 634 charges the decoupling capacitor 626, and the charge stored by the decoupling capacitor 626 is a function of the current along the second path 634. As mentioned above, the current along the second path 634 mirrors the current $I_R$ along the first path 640. The programmable current source 638 provides control over the current $I_R$ in the first path 640. And, the operation of the current mirror 632 allows the current along the second path 634, and thus the charge stored by the decoupling capacitor 626, to be determined at least by the selecting the programmable current source 638.

Current mirror 632 may further comprise PMOS FETs 635 and 637 in some embodiments. Current controlled laser diode driving circuit 600 may also comprise PMOS FET 639 and inductor (LS) 607 in some embodiments.

The current controlled laser diode driving circuit 600 may further comprise: a first switch 642 between the second end 606 of the fly capacitor 602 and the first and second reference terminal 618; a second switch 644 between the second end 606 and output node 654; a third switch 646 between the first voltage supply node 614 and the cathode 612; a fourth switch 647 between the cathode 612 and the first and second reference terminal 618; and a fifth switch 648 between the first end 604 of the fly capacitor 602 and a third voltage supply node 624. In some embodiments, the third voltage supply node 624 is the output node 654 as depicted in FIG. 6.

In various embodiments, the various switches of the current controlled laser diode driving circuit 600 are configured to be activated/deactivated (switched ON/OFF) by control signals. In the embodiment depicted in FIG. 6, first switch 642, decoupling switch 650, and third switch 646 are closed or in an ON state in a first operating state of the current controlled laser diode driving circuit 600. The first switch 642, decoupling switch 650, and third switch 646 are open or in an OFF state in a second operating state of the current controlled laser diode driving circuit 600. On the other hand, the second and fourth switches 644 and 647 are closed or in an ON state in the second operating state and open or in the OFF state in the first operating state. Additionally, the fifth switch 648 is closed or in an ON state, in the first operating state of the current controlled laser diode driving circuit 600 and open or in an OFF state in the second operating state. In one embodiment, the fifth switch 648 is a NMOS FET with its source coupled to the fly capacitor 602 and the drain coupled to the output node 654. One of ordinary skill in the art will appreciate that in different embodiments switches 642, 644, 646, 647, 648 and 650 may comprise different types of switches known in the art and used with different control signal waveforms to achieve the operation described above.

Table I below illustrates the operational state of the various switches within the current controlled laser diode driving circuit 600 when the current controlled laser diode driving circuit 600 is the first operating state and the second operating state.

TABLE I

| Switch | First Operating State | Second Operating State |
|---|---|---|
| 642 | Enable | Disable |
| 644 | Disable | Enable |
| 646 | Enable | Disable |
| 647 | Disable | Enable |
| 648 | Enable | Disable |
| 650 | Enable | Disable |

In Table 1, the switches are described as being enabled when they are conducting (low resistance state) and disabled when they are not conducting (high resistance state).

Accordingly, in various embodiments, the output node 654 and the decoupling capacitor 626 are coupled with the current mirror 632 while the decoupling capacitor 626 is charged. In some embodiments, the output node 654 and the decoupling capacitor are decoupled from the current mirror 632 and the decoupling capacitor 626 during laser-diode pulses. In such embodiments, the decoupling capacitor 626 discharges through the laser diode 608 generating the current pulse through the laser diode 608. The current pulse through the laser diode 608 being determined at least by the programmable current source 638. This allows control of the current through the laser diode 608 by controlling the voltage in the decoupling capacitor 626 rather than controlling the current directly by a programmable current source.

In some embodiments, the fixed current pulse through the laser diode 608 may comprise an average current through the laser diode 608. The average current through the laser diode 608 may be approximately described by the following equation:

$$\overline{I_{LD}} = \frac{NI_R}{2} \cdot (1 - \alpha)$$

where $\overline{I_{LD}}$ is the average current, $I_R$ is the current selected by the programmable current source 638, N defines ratio of the current along the first current path 640 to the second current path 634, and $\alpha$ is the duty cycle of the laser diode 608.

In some embodiments, the peak current through the laser diode may be approximately described by the following equation:

$$I_{LD} = \frac{NI_R}{2} \cdot \frac{T_{\varphi 1}}{T_{\varphi 2}}$$

where $I_{LD}$ is the peak current, $T_{\varphi 2}$ is the period of the current pulse through the diode, and $T_{\varphi 1}$ is the time period of charging the decoupling capacitor. In such embodiments the peak and average currents through the laser diode is further determined by the duty cycle of the laser diode.

The decoupling capacitor 626 and the output node 654 may be coupled and decoupled from the second path 634 by a decoupling switch 650 in some embodiments. FIG. 6 illustrates the decoupling switch 650 as a PMOS FET, but the current controlled laser diode driving circuit 600 may utilize other switches known in the art. Some examples include but are not limited to NMOS FET, bipolar transistors, power diodes, insulated gate bipolar transistors, silicon controlled rectifiers, and gate turn-off thyristors.

The current mirror 632 depicted in FIG. 6 comprises first and second PMOS FETs $M_{P0}$ and $M_{P1}$. Other embodiments may employ other types of current mirrors 632 including, but not limited to embodiments of current mirrors utilizing bipolar junction transistors.

The current controlled laser diode driving circuit 600 may also comprise a voltage doubler in some embodiments. As depicted in FIG. 6, the current control laser diode driving circuit 600 can comprise a fly capacitor 602. The fly capacitor 602 may be arranged in series with the decoupling capacitor 626 between the laser diode 608. In some embodiments, the fly capacitor 602 and the decoupling capacitor 626 may discharge to provide a current pulse to the laser diode 608. The combined voltage of the fly capacitor 602 and the decoupling capacitor 626 may be approximately double the voltage of the decoupling capacitor 626. The fly capacitor 602 may comprise a fly capacitor. The capacitance of the decoupling capacitor 626 may be much larger than the capacitance of the fly capacitor 602, in some embodiments.

As shown in FIG. 6, the fly capacitor 602 may comprise a first end 604 and a second end 606 and similar to the fly capacitor 102 in FIG. 1. The laser diode 608 may comprise an anode 610 and a cathode 612 and similar to the laser diode 108 described in FIG. 1.

FIG. 6 depicts some of the aforementioned switches as MOSFETS, however, in some embodiments, some or all of the aforementioned switches may comprise other types of electronic switches including, but not limited to bipolar transistors, power diodes, insulated gate bipolar transistors, silicon controlled rectifiers, and gate turn-off thyristors.

Figure 7:
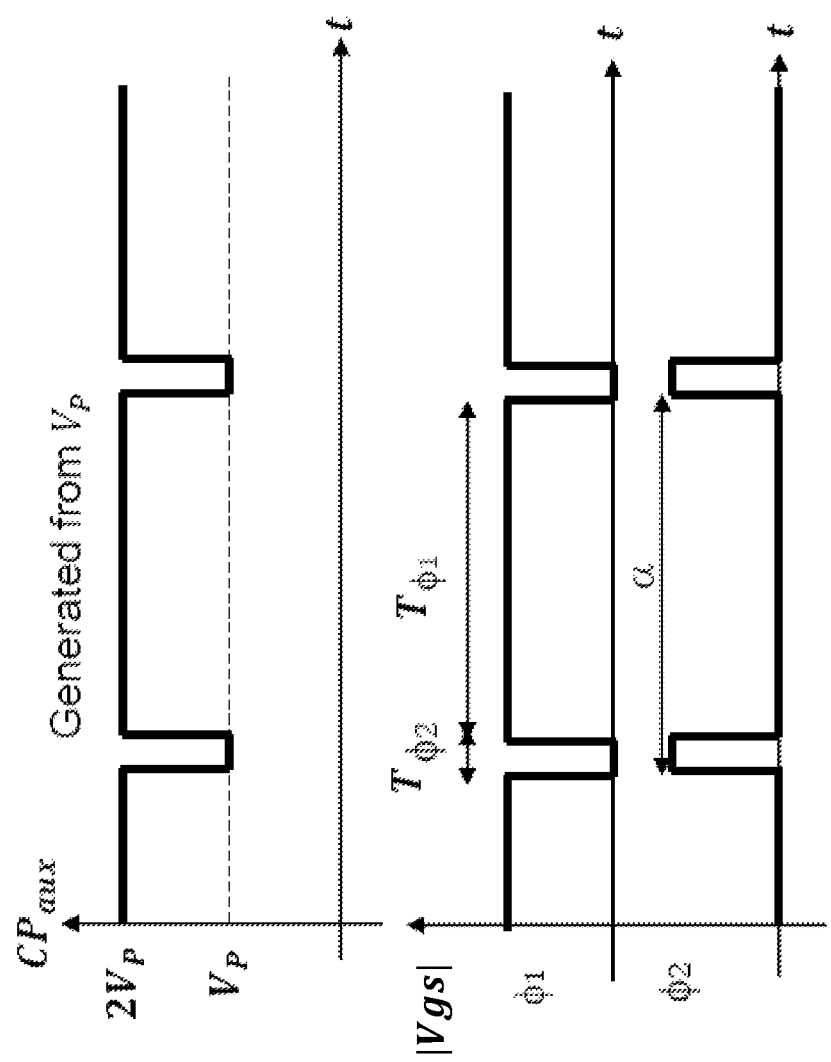
FIG. 7 illustrates waveforms of gate signals that control operation of the switches of the current controlled laser diode driving circuit of FIG. 6 in accordance with an embodiment of the present invention.

FIG. 7 depicts waveforms of gate signals that can control operation of the switches described above in accordance with one embodiment of invention. As shown in FIG. 7, the waveform corresponding to the first control signal $\varphi_1$ is high in the first operating state. The waveform corresponding to the second control signal $\varphi_2$ is high in the second operating state. Note that the waveforms corresponding to the first control signal $\varphi_1$ and the second control signal $\varphi_2$ are independent of the transistor type, High |Vgs| corresponds to a closed gate and low |Vgs| corresponds to an open gate.

The waveform controlling the fifth switch 648 is shown as $CP_{aux}$. The fifth switch 648 is depicted as an NMOS FET and the signal for $CP_{aux}$ is high in the first operating state so the fifth switch 648 in the ON state in the first operating state and in the OFF state in the second operating state. In one embodiment, the NMOS FET may be bootstrapped with the control signal $CP_{aux}$ switching between twice the voltage at the output node 654 and the voltage at the output node 654 (VP). In embodiments, $CP_{aux}$ may be generated from the voltage at the output node 654. As one of ordinary skill in the art will appreciate, 2×VP may be generated from the voltage at the output node 654 using a level shifter structure.

Figure 8:
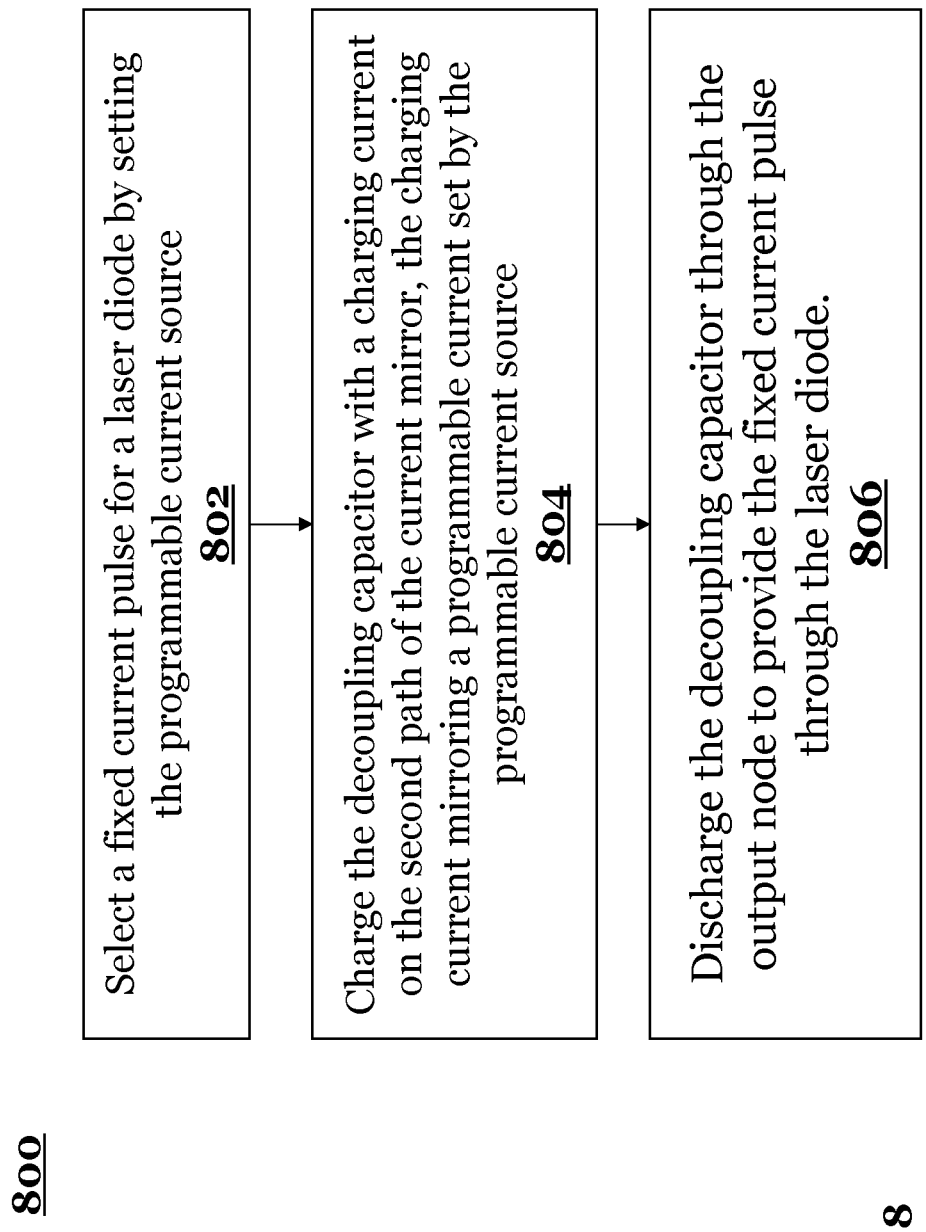
FIG. 8 illustrates a block diagram of a method of operating a current controlled laser diode in accordance with an embodiment of the present invention.

FIG. 8 depicts a block diagram of a method of operating a current controlled laser driver circuit. A method 800 for controlling current through a laser diode comprises having a current mirror coupled to a supply voltage node with a programmable current source coupled to a first path of the current mirror and a decoupling capacitor coupled to a second path of the current mirror, and an output node coupled between the decoupling capacitor and the current mirror on the second path of the current mirror. The method 800 further comprising at 802 selecting a fixed current pulse for a laser diode by setting the programmable current source;

and at 804 charging the decoupling capacitor with a charging current on the second path of the current mirror, the charging current mirroring a programmable current set by the programmable current source. In embodiments, the method 800, further comprises at 606 discharging the decoupling capacitor through the output node to provide the fixed current pulse through the laser diode.

In some embodiments of the method 800, the fixed current pulse comprises an average current and a peak current and wherein the fixed current pulse is further determined by a duty cycle of the laser diode.

In some embodiments, the method 800 further comprises decoupling the output node and the decoupling capacitor from the second path of the current mirror while the decoupling capacitor is discharging.

In some embodiments of the method 800 charging the decoupling capacitor substantially coincides with charging a fly capacitor coupled at a first end to an anode of the laser diode and discharging the decoupling capacitor substantially coincides with discharging the fly capacitor further wherein the first end of the fly capacitor is coupled with the output node while charging and a second end of the fly capacitor is coupled with the output node while discharging.

The programmable current source of some embodiments of method 800 may include, but are not limited to 638. Examples of the laser diode of embodiments of this method 800 include, but are not limited to, 108 and 608. Examples of the fly capacitor of embodiments of this method 800 include, but are not limited to, 102 and 602. Examples of the decoupling capacitor of the method 800 include but are not limited to 626.

Figure 9:
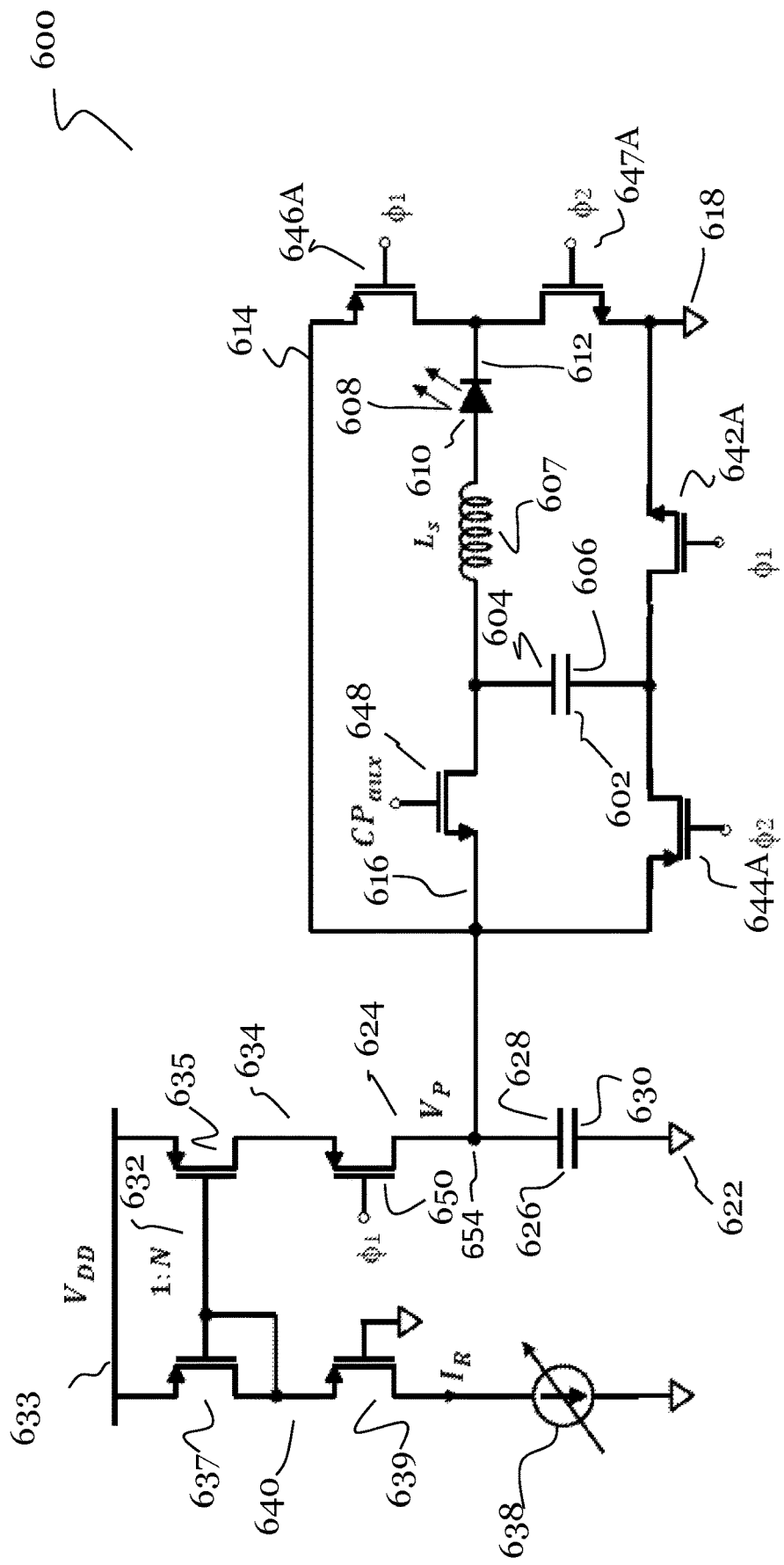
FIG. 9 illustrates a schematic of embodiments of a current controlled laser diode driving circuit.

FIG. 9 illustrates the switching architecture for embodiments of the current controlled laser diode driving circuit 600. The numbering from FIG. 6 has been carried over to FIG. 9. FIG. 9 is a specific embodiment of the embodiment described in FIG. 6.

As depicted in FIG. 9, the second switch 644A comprises a PMOS transistor with an input tied to the first control signal φ₁. The second switch 644A will be in the ON state in the second operating state and in the OFF state in the first operating state.

As depicted in FIG. 9, the first switch 642A comprises a NMOS transistor with an input tied to the first control signal φ₁. The first switch 642A is in the ON state in the first operating state and in the OFF state in the second operating state.

As depicted in FIG. 9, the third switch 646A comprises a PMOS transistor with an input tied to the second control signal φ₂. The third switch 646A is in the ON state in the first operating state and in the OFF state in the second operating state.

As depicted in FIG. 9, the fourth switch 647A comprises a NMOS transistor with an input tied to the second control signal φ₂. As a result, the fourth switch 647A is in the ON state in the second operating state and in the OFF state in the first operating state. Other embodiments may utilize other types of switches and other arrangements known in the art.

Returning to FIG. 6, in some embodiments the third voltage supply node 624 is coupled with the first voltage supply node 614 and coupled with the second voltage supply node 616 wherein a first end 628 of a decoupling capacitor 626 is coupled with the third voltage supply node 624 and a second end 630 of the decoupling capacitor 626 is coupled with a third reference terminal 622.

In some embodiments, the third voltage supply node 624 is coupled with the current mirror 632 in the first operating state and decoupled from the current mirror 632 in the second operating state, the decoupling capacitor 626 being on the second path 634 of the current mirror 632 in the first operating state and a current through the decoupling capacitor 626 in the first operating state being determined by the programmable current source 638 coupled to a first path 640 of the current mirror 632. The current through the second path 634 charges the decoupling capacitor 626 in the first operating state in this arrangement.

In some embodiments, the second end 606 of the fly capacitor 602 is configured to be coupled to the first and second reference terminal 618 in the first operating state by a first switch 642 that is closed in the first operating state and open in the second operating state and configured to be coupled to the third reference terminal 622 via the third voltage supply node 624 in the second operating state by a second switch 644 that is open in the first operating state and closed in the second operating state so the decoupling capacitor 626 is in series with the fly capacitor 602 and the laser diode in the second operating state.

In second operating state the decoupling capacitor 626 may also be decoupled from the second path 634 and the decoupling capacitor 626 discharges in series with the fly capacitor 602 to substantially double the voltage applied to the anode 610 of the laser diode 608 during a pulse.

In some embodiments, the fixed current pulse is further determined by a duty cycle of the laser diode 608 and the fixed current pulse comprises a peak current and an average current.

In some embodiments, the first end 604 of the fly capacitor 602 is coupled to the anode 610 of the laser diode 608 in the first operating state in a parallel arrangement with decoupling capacitor 626 by operation of switches described above. In this state, fly capacitor 602 and the decoupling capacitor 626 will be charged in parallel as shown in FIG. 6.

In the second operating state, operation of the switches described above will place the fly capacitor 602 in a serial arrangement with the decoupling capacitor 626, as shown in FIG. 6 allowing the fly capacitor 602 and the decoupling capacitor 626 to discharge through the laser diode 608 and provide the fixed current pulse. In some such embodiments, the voltage applied to the anode 610 of the laser diode 608 to generate the fixed pulse may substantially double the voltage at the output node 654.

In some embodiments, the second end 606 of the fly capacitor 602 is coupled with the first and second reference terminal 618 in the parallel arrangement and the second end 606 of the fly capacitor 602 is coupled with the output node 654 in the serial arrangement.

In some embodiments, the first end 604 of the fly capacitor 602 is coupled to the output node 654 in the parallel arrangement and wherein the second end 606 of the fly capacitor 602 is coupled with the output node 654 in the serial arrangement by.

In some embodiments, the cathode 612 of the laser diode 608 is coupled to the output node 654 in the parallel arrangement and the cathode 612 of the laser diode 608 is coupled to the first and second reference terminal 618 in the serial arrangement.

In some embodiments, the output node 654 and the decoupling capacitor 626 are decoupled from the current mirror 632 in the serial arrangement.

In some embodiments, in the parallel arrangement, the cathode 612 of the laser diode 608 is coupled to a first voltage supply node 614 at a potential substantially equal to a potential at the output node 654 to provide a reverse bias to the laser diode 608 until the fly capacitor 602 is charged.

In some embodiments, the output node 654 may be coupled with the first voltage supply node 114 of the embodiment of the driver circuit depicted in FIG. 1. In some embodiments, the output node 654 may be coupled with the second voltage supply node 116 of the embodiment of the driver circuit depicted in FIG. 1.

In some embodiments the decoupling capacitor 626 comprises a large capacitance. In some embodiments, the capacitance of the decoupling capacitor 626 is approximately 1 nF. In embodiments where the fly capacitor 602 comprises a fly capacitor, the capacitance of the fly capacitor is approximately 180 pF.

Figure 10:
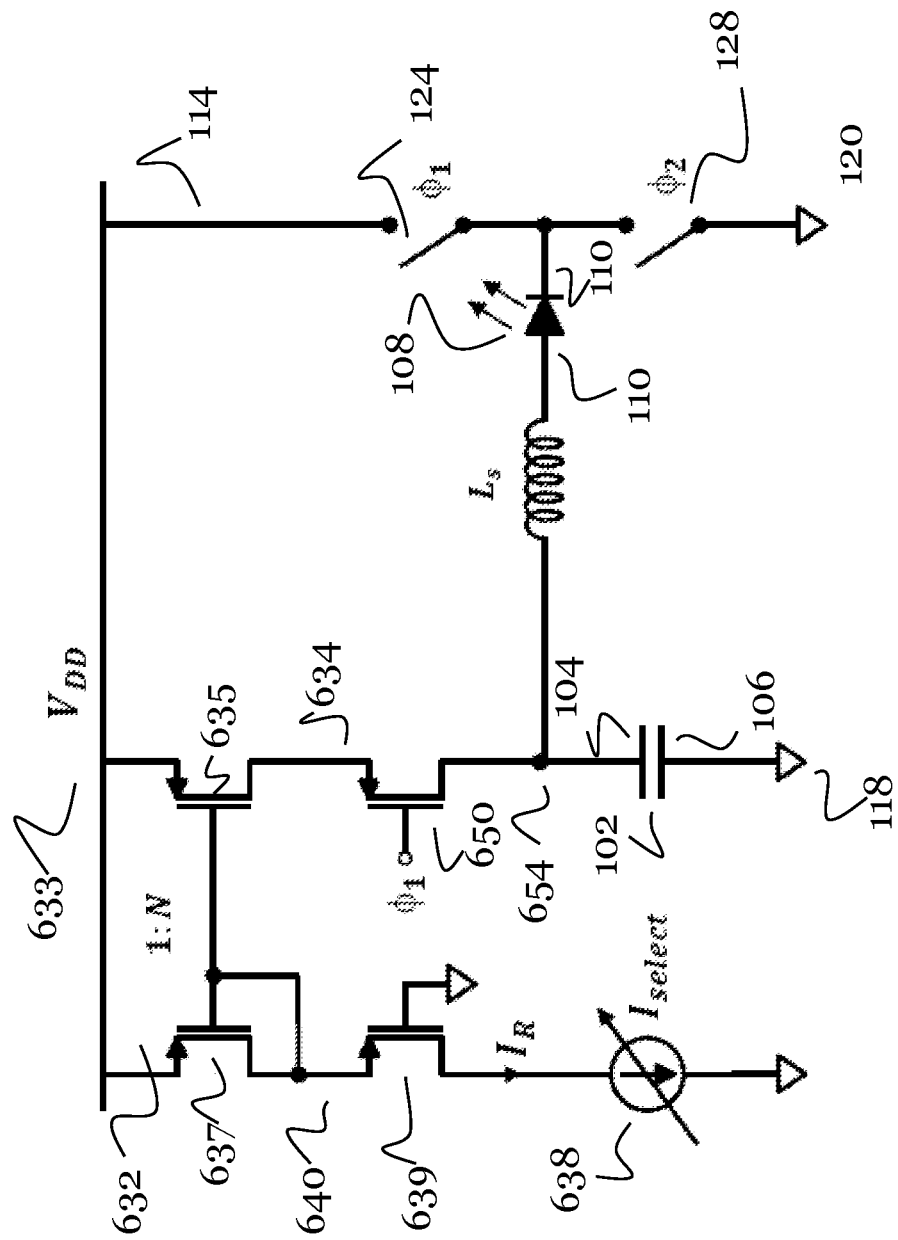
FIG. 10 illustrates a further schematic of a laser driver circuit.

FIG. 10 illustrates a further schematic of a laser driver circuit in accordance with an embodiment of the present invention.

Referring to FIG. 10, in this embodiment, the laser driver circuit of FIG. 1 at the first end 104 of the fly capacitor 102 has been coupled to the output node 654 (e.g., as described in FIG. 6). Consequently, this embodiment, does not have the voltage doubler, and the fly capacitor 102 may be the decoupling capacitor 626 described in FIG. 6 so that a separate fly capacitor (such as fly capacitor 602) can be avoided. First and second control signals $\varphi_1$ and $\varphi_2$ may comprise control signals as explained elsewhere in this specification with reference to FIGS. 2 and 7.

Figure 11:
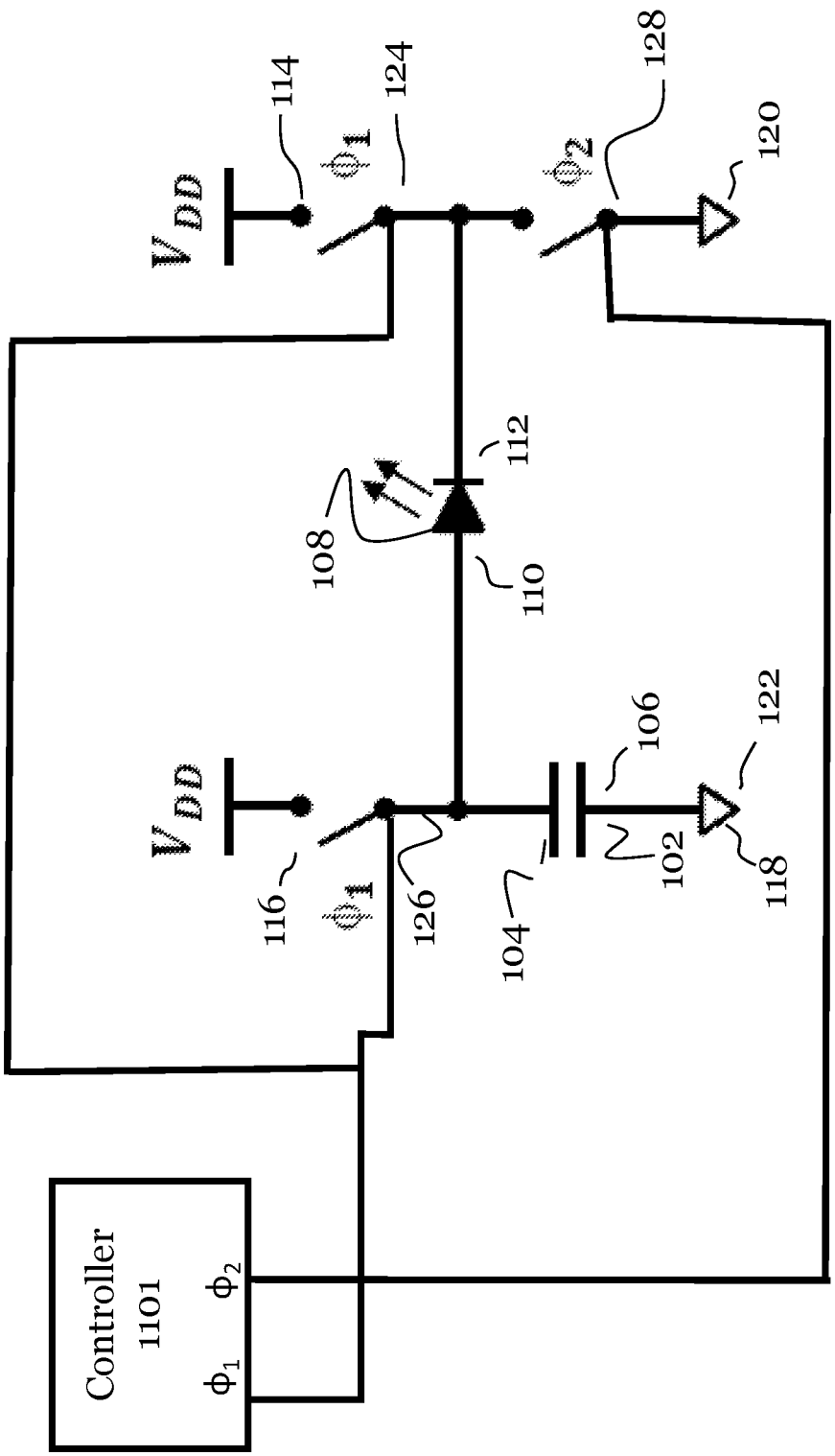
FIG. 11 illustrates an embodiment of a controller of a laser driver circuit.

FIG. 11 illustrates a schematic of a controller for a laser driver in accordance with embodiments of the present invention. As one of ordinary skill in the art will appreciate, a first control signal $\varphi_1$ may be generated by a controller 1101 and coupled to one more switches. Similarly controller 1101 may generate a second control signal $\varphi_2$ and coupled to one more switches. In the embodiment depicted in FIG. 11, the first control signal $\varphi_1$ is coupled to switches 126 and 124, while the second control signal $\varphi_2$ is coupled to switch 128. However, as one of ordinary skill will appreciate, the first control signal $\varphi_1$ may be coupled with any switch in any embodiment of this disclosure controlled by the first control signal $\varphi_1$. Similarly, the second control signal $\varphi_2$ may be coupled with any switch in any embodiment of this disclosure denoted as receiving the second control signal $\varphi_2$.

Example 1

A driver circuit including: a fly capacitor including a first end and a second end; a laser diode including an anode and a cathode, where the driver circuit is configured to operate in a first operating state and a second operating state, the anode being coupled to the first end of the fly capacitor, where, in the first operating state, the cathode is coupled to a first voltage supply node, the first end of the fly capacitor is coupled to a second voltage supply node, the second end of the fly capacitor is coupled to a first reference terminal; and where, in the second operating state, the cathode is coupled to a second reference terminal and decoupled from the first voltage supply node, the first end of the fly capacitor is decoupled from the second voltage supply node, the second end of the fly capacitor is coupled to a third reference terminal.

Example 2

The driver circuit of example 1 further including a third voltage supply node coupled with the first voltage supply node and coupled with the second voltage supply node, where a first end of a decoupling capacitor is coupled with the third voltage supply node and a second end of the decoupling capacitor is coupled with the third reference terminal.

Example 3

The driver circuit of one of examples 1 or 2, where the third voltage supply node is coupled with a current mirror in the first operating state and decoupled from the current mirror in the second operating state, the decoupling capacitor being on a second path of the current mirror in the first operating state and a current through the decoupling capacitor in the first operating state being determined by a programmable current source coupled to a first path of the current mirror.

Example 4

The driver circuit of one of examples 1 to 3, where the first reference terminal is the second reference terminal, and where the second end of the fly capacitor is configured to be coupled to the first reference terminal in the first operating state by a first switch that is closed in the first operating state and open in the second operating state and configured to be coupled to the third reference terminal via the third voltage supply node in the second operating state by a second switch that is open in the first operating state and closed in the second operating state so the decoupling capacitor is in series with the fly capacitor and the laser diode in the second operating state.

Example 5

The driver circuit of one of examples 1 to 4, where the second reference terminal is the third reference terminal.

Example 6

The driver circuit of one of examples 1 to 5, where the first voltage supply node is the second voltage supply node.

Example 7

The driver circuit of one of examples 1 to 6, where the laser diode is reverse biased in the first operating state until the fly capacitor is charged to a potential substantially equal to the potential at the first voltage supply node.

Example 8

The driver circuit of one of examples 1 to 7, where the first end of the fly capacitor is coupled to the second voltage supply node in the first operating state by a first switch that is closed in the first operating state and open in the second operating state.

Example 9

The driver circuit of one of examples 1 to 8, where the cathode is coupled to the first voltage supply node in the first operating state by a switch that is closed in the first operating state and open in the second operating state.

Example 10

The driver circuit of one of examples 1 to 9, where the cathode is coupled to the second reference terminal in the second operating state by a switch that is open in the first operating state and closed in the second operating state.

Example 11

A method of operating a laser diode, the method including: having a driver circuit including an fly capacitor including a first end and a second end, and a laser diode including an anode and a cathode, the anode being coupled to the first end of the fly capacitor; charging the first end of the fly capacitor to a first potential; generating a current pulse by discharging the fly capacitor through the laser diode by driving the laser diode in forward bias; and recharging the first end of the fly capacitor to the first potential and driving the laser diode in reverse bias.

Example 12

The method of example 11 further including coupling the cathode to a supply voltage while the fly capacitor is recharging, the supply voltage being substantially equal to the first potential so as to reverse bias the laser diode until the fly capacitor is recharged to the first potential.

Example 13

The method of one of examples 11 or 12 further including decoupling the cathode from the supply voltage by one or more switches when the laser diode is driven in forward bias.

Example 14

The method of one of examples 11 to 13, where the first end of the fly capacitor and the anode are decoupled from a charging energy source by one or more switches when the fly capacitor is discharging.

Example 15

The method of one of examples 11 to 14 further including determining the magnitude of the current pulse by setting a programmable current source of a current control driver that mirrors a charging current of a decoupling capacitor that is charged in parallel with the fly capacitor and discharged in series with the fly capacitor while the fly capacitor is discharged to generate the current pulse.

Example 16

The method of one of examples 11 to 15 further including toggling the decoupling capacitor and the fly capacitor between a parallel arrangement and a serial arrangements with one or more switches.

Example 17

The method of one of examples 11 to 16, where determining the current pulse determines a peak current and an average current through the laser diode during the current pulse.

Example 18

The method of one of examples 11 to 17, where a peak current and an average current is each further determined by a duty cycle of the current pulse.

Example 19

A driver circuit including: a current mirror coupled to a supply voltage node; a programmable current source coupled to a first path of the current mirror; a decoupling capacitor coupled to a second path of the current mirror; an output node coupled between the decoupling capacitor and the current mirror on the second path; and a laser diode coupled to the output node, where the driver circuit is configurable to provide a fixed current pulse through the laser diode by selecting the programmable current source.

Example 20

The driver circuit of example 19, where the fixed current pulse is further determined by a duty cycle of the laser diode and the fixed current pulse includes a peak current and an average current.

Example 21

The driver circuit of one of examples 19 or 20, further including a fly capacitor including a first end coupled to an anode of the laser diode and where the decoupling capacitor and the fly capacitor are charged in a parallel arrangement and discharged in a serial arrangement to provide the fixed current pulse.

Example 22

The driver circuit of one of examples 19 to 21, where a second end of the fly capacitor is coupled with a first reference terminal in the serial arrangement and where the second end of the fly capacitor is coupled with the output node in the parallel arrangement.

Example 23

The driver circuit of one of examples 19 to 22, where the first end of the fly capacitor is coupled to the output node in the parallel arrangement and where a second end of the fly capacitor is coupled to the output node in the serial arrangement.

Example 24

The driver circuit of one of examples 19 to 23, where the fly capacitor and decoupling capacitor may be toggled between the parallel arrangement and the serial arrangement by one or more switches.

Example 25

The driver circuit of one of examples 19 to 24, where a cathode of the laser diode is coupled to the output node in the parallel arrangement and the cathode of the laser diode is coupled to a first reference terminal in the serial arrangement.

Example 26

The driver circuit of one of examples 19 to 25, where the output node and the decoupling capacitor are decoupled from the current mirror in the serial arrangement.

Example 27

The driver circuit of one of examples 19 to 26, where, in the parallel arrangement, a cathode of the laser diode is coupled to a voltage supply node at a potential substantially equal to a potential at the output node to provide a reverse bias to the laser diode until the fly capacitor is charged.

Example 28

A method for controlling current through a laser diode including: having a current mirror coupled to a supply voltage node with a programmable current source coupled to a first path of the current mirror and a decoupling capacitor coupled to a second path of the current mirror, and an output node coupled between the decoupling capacitor and the current mirror on the second path of the current mirror; selecting a fixed current pulse for a laser diode by setting the programmable current source; charging the decoupling capacitor with a charging current on the second path of the current mirror, the charging current mirroring a programmable current set by the programmable current source; and discharging the decoupling capacitor through the output node to provide the fixed current pulse through the laser diode.

Example 29

The method of example 28, where the fixed current pulse includes an average current and a peak current and where the fixed current pulse is further determined by a duty cycle of the laser diode.

Example 30

The method of one of examples 28 or 29, where the output node and the decoupling capacitor are decoupled from the second path of the current mirror while the decoupling capacitor is discharging.

Example 31

The method of one of examples 28 to 30, where charging the decoupling capacitor substantially coincides with charging a fly capacitor coupled at a first end to an anode of the laser diode and discharging the decoupling capacitor substantially coincides with discharging the fly capacitor further where the first end of the fly capacitor is coupled with the output node while charging and a second end of the fly capacitor is coupled with the output node while discharging.

Example 32

The method of one of examples 28 to 31, where a cathode of the laser diode is coupled with the output node while the decoupling capacitor is charging and the cathode is coupled to a reference terminal while the decoupling capacitor is discharging.

Example 33

The method of one of examples 28 to 32, where, while the fly capacitor is charging, a cathode of the laser diode is coupled to a voltage supply node providing a potential substantially equal to the potential at the output node thereby reverse biasing the laser diode until the fly capacitor is charged.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A driver circuit comprising:
    a fly capacitor comprising a first end and a second end;
    a laser diode comprising an anode and a cathode, wherein the driver circuit is configured to operate in a first operating state and a second operating state, the anode being coupled to the first end of the fly capacitor,
    wherein, in the first operating state, the cathode is coupled to a first voltage supply node to reverse bias the laser diode, the first end of the fly capacitor is coupled to a second voltage supply node, the second end of the fly capacitor is coupled to a first reference terminal so the first end of the fly capacitor is positively charged with respect to the first reference terminal; and
    wherein, in the second operating state, the cathode is coupled to a second reference terminal and decoupled from the first voltage supply node, the first end of the fly capacitor is decoupled from the second voltage supply node to discharge the fly capacitor through the laser diode in forward bias, and the second end of the fly capacitor is coupled to the first reference terminal.

2. The driver circuit of claim 1, wherein the second voltage supply node is coupled with a current mirror in the first operating state and decoupled from the current mirror in the second operating state, the fly capacitor being on a second path of the current mirror in the first operating state and a current through the fly capacitor in the first operating state being determined by a programmable current source coupled to a first path of the current mirror.

3. The driver circuit of claim 1, wherein the laser diode is reverse biased in the first operating state until the fly capacitor is charged to a potential substantially equal to the potential at the first voltage supply node.

4. The driver circuit of claim 1, wherein the first end of the fly capacitor is coupled to the second voltage supply node in the first operating state by a first switch that is closed in the first operating state and open in the second operating state.

5. The driver circuit of claim 1, wherein the cathode is coupled to the first voltage supply node in the first operating state by a switch that is closed in the first operating state and open in the second operating state.

6. The driver circuit of claim 1, wherein the cathode is coupled to the second reference terminal in the second operating state by a switch that is open in the first operating state and closed in the second operating state.

7. A method of operating a laser diode, the method comprising:
    having a driver circuit comprising a fly capacitor comprising a first end and a second end, and a laser diode comprising an anode and a cathode, the anode being coupled to the first end of the fly capacitor;
    charging the first end of the fly capacitor to a first positive potential by coupling a supply voltage to the first end;
    generating a current pulse by discharging the fly capacitor through the laser diode by driving the laser diode in forward bias; and
    recharging the first end of the fly capacitor to the first positive potential while reverse biasing the laser diode.

8. The method of claim 7 further comprising coupling the cathode to the supply voltage while the fly capacitor is recharging, the supply voltage reverse biasing the laser diode until the fly capacitor is recharged to the first positive potential.

9. The method of claim 8 further comprising decoupling the cathode from the supply voltage by one or more switches when the laser diode is driven in forward bias.

10. The method of claim 7, wherein the first end of the fly capacitor and the anode are decoupled from the supply voltage by one or more switches when the fly capacitor is discharging.

11. The method of claim 7 further comprising determining a magnitude of the current pulse by setting a programmable current source of a current control driver that mirrors a charging current of the fly capacitor.

12. The method of claim 11, wherein determining the current pulse comprises determining a peak current and an average current through the laser diode during the current pulse.

13. The method of claim 12, wherein the peak current and the average current are determined by a duty cycle of the current pulse.

14. A driver circuit comprising:
- a current mirror coupled to a supply voltage node, the current mirror being configured so a ratio of current along a first path of the current mirror to current along a second path of the current mirror substantially equals 1 to a number N;
- a programmable current source coupled to the first path of the current mirror;
- a fly capacitor coupled to the second path of the current mirror;
- an output node coupled between the fly capacitor and the current mirror on the second path; and
- a laser diode coupled to the output node, wherein the driver circuit is configurable to provide a fixed current pulse through the laser diode by setting the programmable current source to a current; and wherein the driver circuit is configured to provide a reverse bias to the laser diode.

15. The driver circuit of claim 14, wherein the fixed current pulse is further determined by a duty cycle of the laser diode and the fixed current pulse comprises a peak current and an average current.

16. The driver circuit of claim 14, wherein a first end of the fly capacitor is coupled to an anode of the laser diode.

17. The driver circuit of claim 16, wherein a second end of the fly capacitor is coupled with a first reference terminal.

18. The driver circuit of claim 17, wherein the first end of the fly capacitor is coupled to the output node.

19. The driver circuit of claim 18, wherein during a first operating state a cathode of the laser diode is coupled to a voltage supply node at a potential substantially equal to a potential at the output node to provide the reverse bias to the laser diode until the fly capacitor is charged.

20. The driver circuit of claim 19, wherein during a second operating state, the cathode is coupled to a second reference terminal and decoupled from the voltage supply node.

21. The driver circuit of claim 20, wherein during the second operating state, the output node is decoupled from the second path so the fly capacitor discharges through the laser diode.

22. The driver circuit of claim 21, further comprising a switch on the second path configured to decouple the output node from the second path during the second operating state.

23. The driver circuit of claim 20, wherein the cathode is decoupled from the voltage supply node during the second operating state by a first switch.

24. The driver circuit of claim 23, wherein the cathode is coupled to second reference terminal during the first operating state by a second switch.

25. A method for controlling current through a laser diode comprising:
- having a current mirror coupled to a supply voltage node with a programmable current source coupled to a first path of the current mirror and a fly capacitor coupled to a second path of the current mirror, and an output node coupled between the fly capacitor and the current mirror on the second path of the current mirror;
- selecting a fixed current pulse for a laser diode by setting the programmable current source;
- charging the fly capacitor with a charging current on the second path of the current mirror, the charging current mirroring a programmable current set by the programmable current source; and
- discharging the fly capacitor through the output node to provide the fixed current pulse through the laser diode.

26. The method of claim 25, wherein the fixed current pulse comprises an average current and a peak current and wherein the fixed current pulse is further determined by a duty cycle of the laser diode.

27. The method of claim 25, wherein the output node and the fly capacitor are decoupled from the second path of the current mirror while the fly capacitor is discharging.

28. The method of claim 25, wherein, while the fly capacitor is charging, a cathode of the laser diode is coupled to a voltage supply node providing a potential substantially equal to the potential at the output node thereby reverse biasing the laser diode until the fly capacitor is charged.

* * * * *